(12) United States Patent
Hsieh

(10) Patent No.: US 8,766,166 B2
(45) Date of Patent: Jul. 1, 2014

(54) SWITCH WITH MULTIPLE TRIGGER FUNCTION

(76) Inventor: Chung-Cheng Hsieh, New Taipei (TW)

( * ) Notice: Subject to any disclaimer, the term of this patent is extended or adjusted under 35 U.S.C. 154(b) by 67 days.

(21) Appl. No.: 13/609,911

(22) Filed: Sep. 11, 2012

(65) Prior Publication Data

US 2013/0076431 A1  Mar. 28, 2013

(30) Foreign Application Priority Data

Sep. 22, 2011 (TW) .............................. 100217745 U

(51) Int. Cl.
*H03K 17/94* (2006.01)
(52) U.S. Cl.
CPC ...... *H03K 17/94* (2013.01); *H03K 2217/94036* (2013.01)
USPC ........................................................ 250/221
(58) Field of Classification Search
CPC .............................. H03K 17/945; G06F 3/041
USPC ................. 250/221, 222.1; 200/600; 345/173
See application file for complete search history.

(56) References Cited

U.S. PATENT DOCUMENTS

| 6,765,193 B2 * | 7/2004 | Sumriddetchkajorn ...... 250/221 |
| 2008/0106523 A1 * | 5/2008 | Conrad .......................... 345/173 |
| 2012/0318657 A1 * | 12/2012 | Hoffknecht et al. .......... 200/600 |

* cited by examiner

*Primary Examiner* — Seung C Sohn
(74) *Attorney, Agent, or Firm* — Guice Patents PLLC

(57) ABSTRACT

The present invention relates to a switch with multiple trigger function, which comprises: a touch switch having a button thereon; a first sensor having a sensing zone; and a microcontroller coupled to the touch switch and the first sensor; when the button is pressed by an object, the touch switch is conducted, and the microcontroller executes actions corresponding to the touch switch, thereby driving a controlled device; or when the object enters the sensing zone, the first sensor senses the signal change, and the microcontroller enables the touch switch to be conducted according to the signal change, or generates a signal the same as the signal for conducting the touch switch for executing corresponding actions, thereby driving a controlled device.

6 Claims, 4 Drawing Sheets

SWITCH WITH MULTIPLE TRIGGER FUNCTION

BACKGROUND OF THE INVENTION

1. Field of the Invention

The present invention relates to a switch with multiple trigger function, especially to a switch with multiple trigger function allowing a user to achieve the objective of pressing switch by means of touching or not touching.

2. Description of Related Art

A conventional switch, especially a button used in an elevator, is a touch switch which requires a user to use his/her finger or other object, e.g. a pen, to press the button for actuating the elevator so as to reach the floor he/she wants to go. However, for an elevator in certain place which requires safety control, such as the elevator in a hospital, the medical personnel wearing gloves is prohibited from touching any button of the elevator due to the concerns of infection occurrences. As such, when the medical personnel wants to take the elevator, he/she is required to take off the gloves before touching the button of the elevator; the situation is not convenient, especially for the medical personnel, and shall be improved.

In view of the disadvantage of conventional touch switch, the present invention provides a switch with multiple trigger function for improving the disadvantage.

SUMMARY OF THE INVENTION

One primary objective of the present invention is to provide a switch with multiple trigger function allowing a user to achieve the objective of pressing switch by means of touching or not touching.

Another objective of the present invention is to provide a switch with multiple trigger function which comprises at least a sensor for increasing the sensing zone thereby providing an easier operation to the user.

For achieving the objectives, the present invention provides a switch with multiple trigger function, which comprises: a touch switch having a button thereon which activates the touch switch; a first sensor having a sensing zone, the touch switch or button is disposed in the sensing zone; and a microcontroller coupled to the touch switch and the first sensor; when the button is pressed by an object, the touch switch is conducted, and the microcontroller executes actions corresponding to the touch switch, thereby driving a controlled device; or when the object enters the sensing zone, the first sensor senses the signal change, and the microcontroller enables the touch switch to be equivalently conducted according to the signal change, and executes corresponding actions, thereby driving the controlled device.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
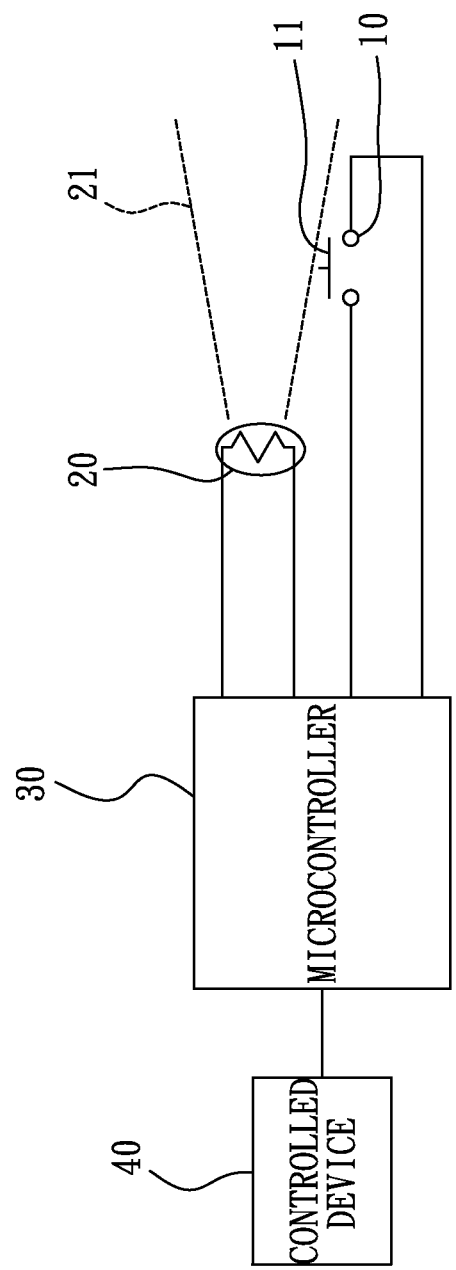
FIG. 1 is a block diagram illustrating the switch with multiple trigger function according to one preferred embodiment of the present invention.

Referring to FIG. 1, which is a block diagram illustrating the switch with multiple trigger function according to one preferred embodiment of the present invention.

As shown in FIG. 1, the switch with multiple trigger function provided by the present invention comprises: a touch switch 10; a first sensor 20; and a microcontroller 30.

The touch switch 10 is a general switch, e.g. but not limited to a switch used in an elevator, and is installed with a button 11 thereon which activates the touch switch 10, wherein when the button 11 is pressed, the touch switch 10 is enabled to be in a conductive state.

The first sensor 20 has a sensing zone 21, the touch switch 10 or button 11 is disposed in the sensing zone 21. The first sensor 20 is, e.g. but not limited to, a light sensor, a capacitive sensor, a magnetic sensor, an image sensor, an ultrasonic sensor, a laser sensor or a radio wave sensor; when a light sensor is adopted as the first sensor 20, the first sensor 20 can receive a light beam, e.g. but not limited to a visible light beam or infrared, the source of the light beam is disposed at the opposite side relative to the first sensor 20; when a capacitive sensor is adopted as the first sensor 20, the first sensor 20 can receive a sense voltage, and the sense voltage is the voltage sensed by the capacitive sensor 20 when an object, e.g. but not limited to a finger, a semitransparent or a non-transparent object, approaches the capacitive sensor 20. For providing a full and clear disclosure, a light sensor is adopted for illustration and shall not be seen as a limitation to the scope of the present invention, when the object enters the sensing zone 21 of the first sensor 20, the light beam is shielded, and the first sensor 20 is enabled to sense the luminance change thereby generating and sending a signal to the microcontroller 30.

The microcontroller 30 is coupled to the first sensor 20, and is installed with plural input/output ports (not shown) for being coupled to the first sensor 20. In addition, the microcontroller 30 can execute actions corresponding to the touch switch 10 thereby driving a controlled device 40, wherein, the controlled device 40 is, e.g. but not limited to, an elevator, a public telephone, a drinking fountain or an auto teller machine (ATM); an elevator is adopted in this embodiment for illustration and shall not be seen as a limitation to the scope of the present invention.

Figure 2:
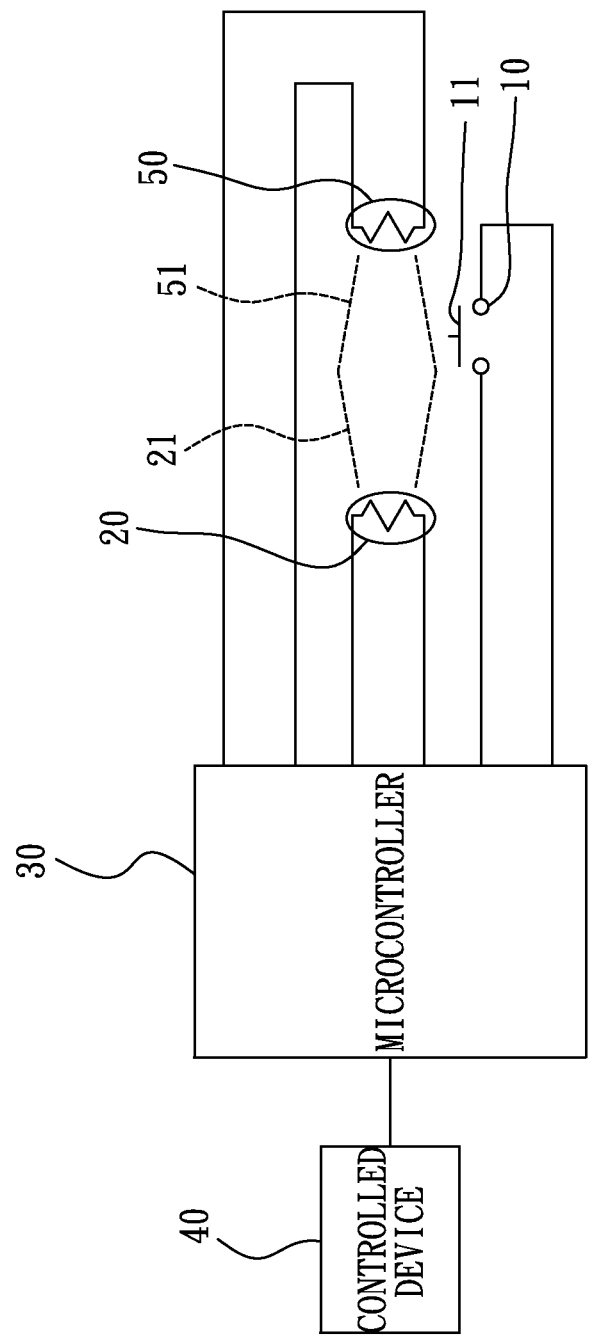
FIG. 2 is a block diagram illustrating the switch with multiple trigger function according to another preferred embodiment of the present invention.

Referring to FIG. 2, which is a block diagram illustrating the switch with multiple trigger function according to another preferred embodiment of the present invention. As shown in FIG. 2, the switch with multiple trigger function provided by the present invention further includes a second sensor 50 having a second sensing zone 51 and coupled to the microcontroller 30, the touch switch 10 is also disposed in the second sensing zone 51 thereby both of the sensing zones 21, 51 of the first sensor 20 and the second sensor 50 being able to sense the signal change. Wherein, the second sensor 50 is, e.g. but not limited to, a light sensor, a capacitive sensor, a magnetic sensor, an image sensor, an ultrasonic sensor, a laser sensor or a radio wave sensor, the type of the second sensor 50 can be the same as or different from that of the first sensor 20, for example both are light sensors, both are capacitive sensors, or one is a light sensor and the other is a capacitive sensor.

Figure 3A:
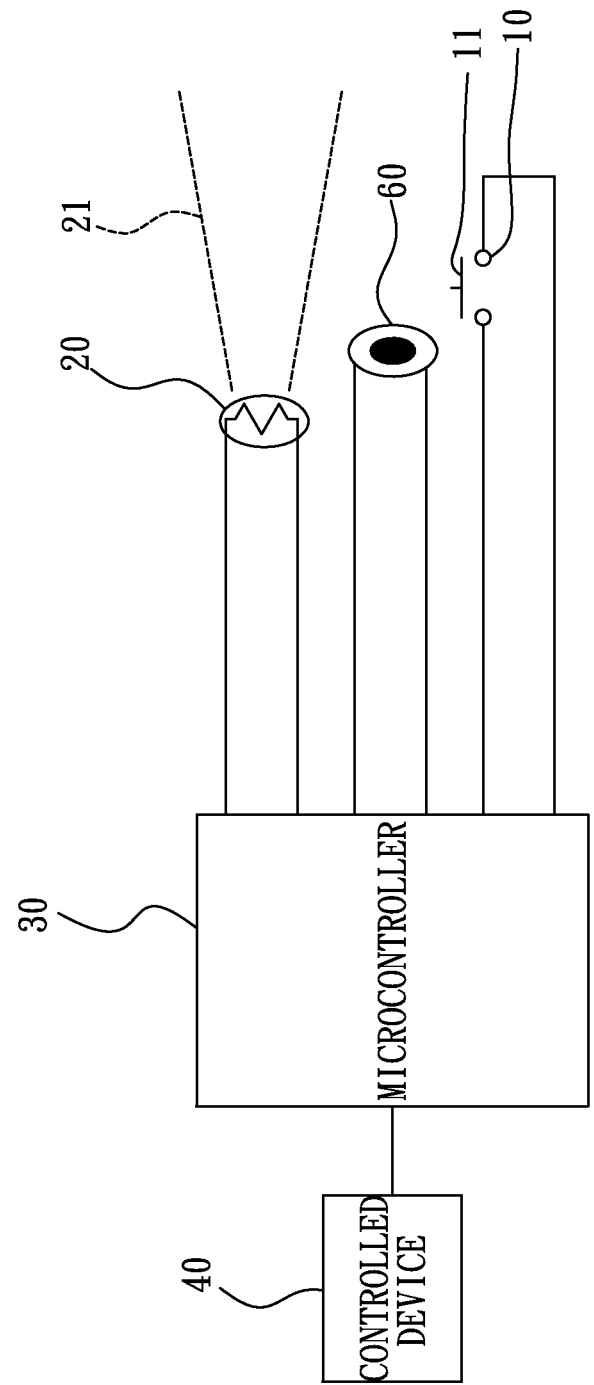
FIG. 3a is a block diagram illustrating the switch with multiple trigger function being further installed with a drive device according to another preferred embodiment of the present invention.
Figure 3B:
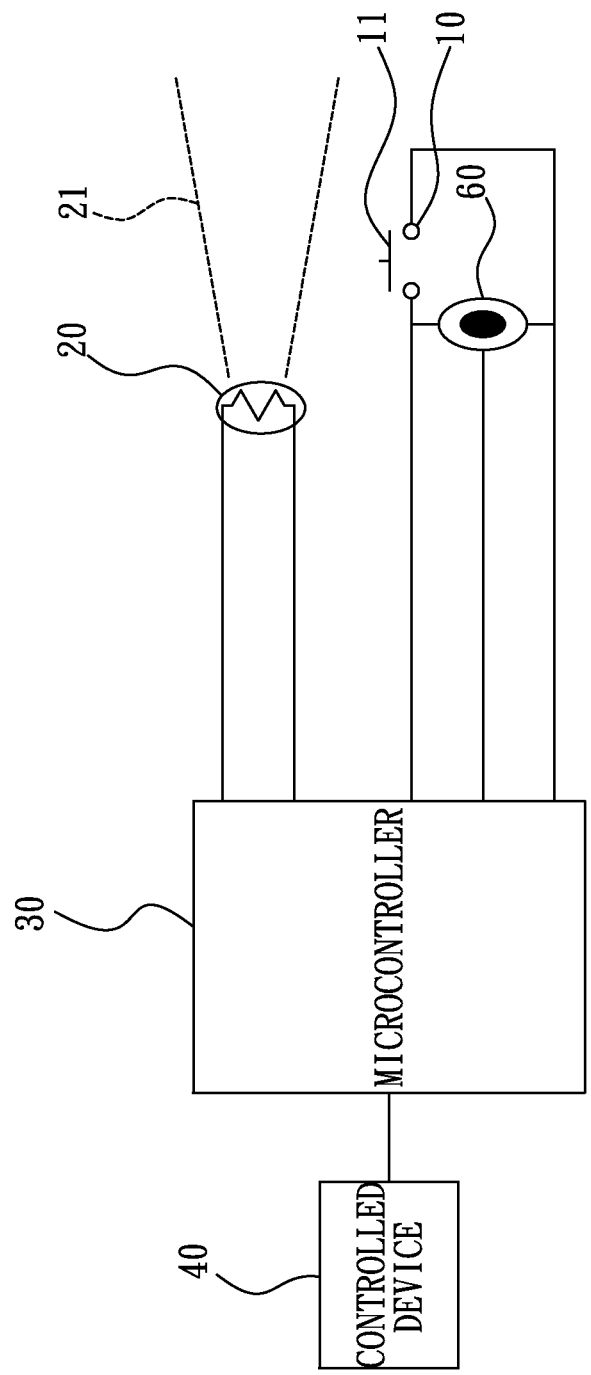
FIG. 3b is a block diagram illustrating the drive device being connected in parallel with the touch switch according to the present invention.

Referring to FIG. 3a and FIG. 3b, wherein FIG. 3a is a block diagram illustrating the switch with multiple trigger function being further installed with a drive device according to another preferred embodiment of the present invention, and FIG. 3b is a block diagram illustrating the drive device being connected in parallel with the touch switch according to the present invention. As shown in FIG. 3a, the switch with multiple trigger function provided by the present invention further includes a drive device 60 which is preferred to be a motor, coupled to the microcontroller 30 and disposed at one side of the touch switch 10, and the drive device 60 can be controlled by the microcontroller 30 thereby driving the touch switch 10 to press the button 11 for allowing to be conducted.

As shown in FIG. 3b, the drive device 60 of the present invention can be a relay or a transistor, and has a control pin connected to the microcontroller 30, another two pins are connected in parallel with the button 11, the control pin is controlled by the microcontroller 30 for conducting the relay 60 thereby generating a signal which is the same as the signal for pressing the touch switch 10.

When in use, the first sensor 20 is disposed on the touch switch 10, e.g. but not limited to the upper left side of a switch used in an elevator, and the second sensor 50 is disposed on the upper right side of the touch switch 10, when an object, e.g. but not limited to a user's finger or a semitransparent or a nontransparent object, directly presses the button 11, the touch switch 10 is conducted, and the microcontroller 30 executes actions corresponding to the touch switch 10 thereby driving the controlled device 40, e.g. an elevator, to be controlled by the microcontroller 30 for ascending or descending; or when the object enters the sensing zone 21, the first sensor 20 and the second sensor 50 sense the signal change, and the microcontroller 30 enables the touch switch 10 to be equivalently conducted according to the signal change and executes the corresponding actions for driving the controlled device 40, e.g. an elevator, to be controlled by the microcontroller 30 for ascending or descending, thereby achieving the objective of substantially pressing the touch switch 10. As such, the switch with multiple trigger function provided by the present invention allows a user to achieve the objective of pressing switch by means of touching or not touching the substantial switch, thereby improving the disadvantages of the conventional touch switch.

As what is disclosed above, the switch with multiple trigger function provided by the present invention allows a user to achieve the objective of pressing switch by means of touching or not touching the substantial switch, so the present invention is novel compared to the conventional touch switch.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. A switch with multiple trigger function, comprising:
    a touch switch having a button thereon which activates said touch switch;
    a first sensor having a sensing zone, said touch switch or said button being disposed in said sensing zone; and
    a microcontroller coupled to said touch switch and said first sensor;
    a drive device coupled to said microcontroller and disposed at one side of said touch switch, and capable of being controlled by said microcontroller thereby driving said touch switch to be conducted, or said drive device generates a signal which is the same as the signal for pressing said touch switch;
    wherein, when said button being pressed by an object, said touch switch being conducted, and said microcontroller executing actions corresponding to said touch switch, thereby driving a controlled device; or when said object entering said sensing zone, said first sensor sensing the signal change, and said microcontroller enabling said touch switch to be equivalently conducted according to said signal change, or said microcontroller generating a signal the same as the signal for conducting said touch switch for executing corresponding actions, thereby driving said controlled device.

2. The switch with multiple trigger function as claimed in claim 1, wherein said first sensor is a light sensor, a capacitive sensor, a magnetic sensor, an image sensor, an ultrasonic sensor, a laser sensor or a radio wave sensor.

3. The switch with multiple trigger function as claimed in claim 1, wherein said object is a finger, a semitransparent object or a nontransparent object.

4. The switch with multiple trigger function as claimed in claim 2, further including a second sensor having a second sensing zone and coupled to said microcontroller, said touch switch is also disposed in said second sensing zone thereby both of said sensing zones of said first sensor and said second sensor being able to sense the signal change.

5. The switch with multiple trigger function as claimed in claim 4, wherein said second sensor is the same as or different from said first sensor.

6. The switch with multiple trigger function as claimed in claim 1, wherein said drive device is a relay or a transistor.

* * * * *